United States Patent [19]

Blatter et al.

[11] 4,241,450
[45] Dec. 23, 1980

[54] AUTOMATIC TURN-OFF APPARATUS FOR A RADIO OR TELEVISION RECEIVER

[75] Inventors: Harold Blatter; Juri Tults, both of Indianapolis, Ind.

[73] Assignee: RCA Corporation, New York, N.Y.

[21] Appl. No.: 70,021

[22] Filed: Aug. 27, 1979

[51] Int. Cl.$^3$ .............................................. H04B 1/16
[52] U.S. Cl. .................................. 455/182; 358/188; 358/191.1; 358/193.1; 358/195.1; 358/190; 455/179; 455/192; 455/260; 455/229; 455/230
[58] Field of Search ..................... 358/193.1, 190, 188, 358/195.1; 455/173, 177, 179, 181, 182, 183, 192, 200, 229, 230, 257, 258, 260

[56] References Cited

U.S. PATENT DOCUMENTS

| | | | |
|---|---|---|---|
| 3,218,388 | 11/1965 | Jobe et al. | 358/193.1 |
| 3,906,150 | 9/1975 | Ivas | 178/7.3 R |
| 4,031,549 | 6/1977 | Rast et al. | 358/193 |

OTHER PUBLICATIONS

Zenith "System 3" Receiver Product Description Model L1320 W May 1979.

*Primary Examiner*—Robert L. Richardson
*Attorney, Agent, or Firm*—Eugene M. Whitacre; Paul J. Rasmussen; Peter M. Emanuel

[57] ABSTRACT

A television receiver includes a tuning system comprising a phase locked loop (PLL) configuration and an automatic fine tuning (AFT) configuration which are selectively enabled to operate in response to respective levels of a MODE signal to tune standard and nonstandard frequency RF carriers. In the absence of the RF carrier for a selected channel, the operations of PLL and AFT configurations are alternately enabled and the level of the MODE signal changes accordingly. The MODE signal is applied to a capacitor which develops a control voltage for turning the receiver "off" after the MODE signal has changed levels for a predetermined time because of the absence of a RF carrier.

10 Claims, 1 Drawing Figure

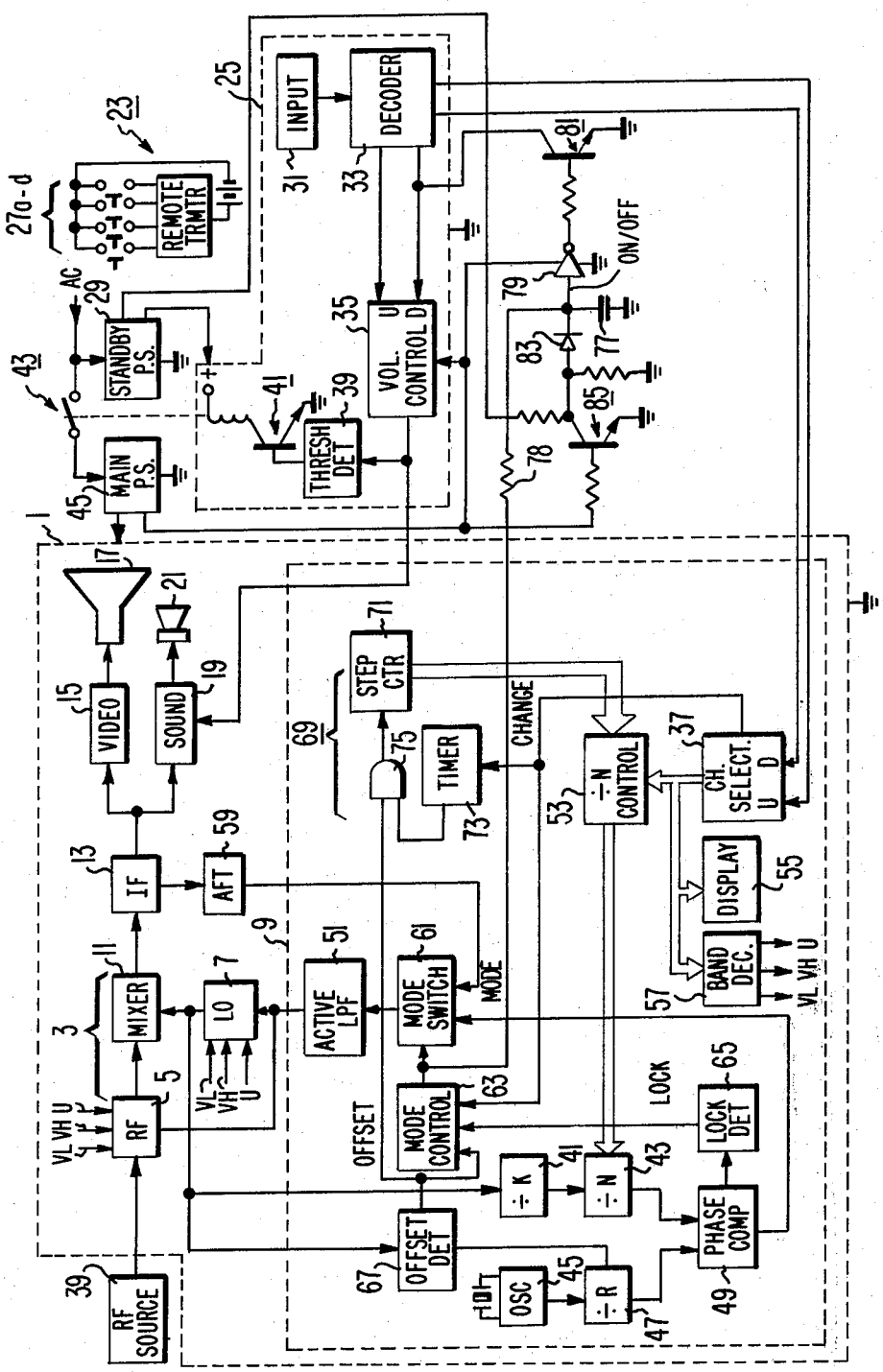

AUTOMATIC TURN-OFF APPARATUS FOR A RADIO OR TELEVISION RECEIVER

BACKGROUND OF THE INVENTION

The present invention relates to the field of apparatus for automatically turning a radio or television receiver off.

Timers are known for turning electronic equipment on and off at predetermined times. In radio and television receivers, such arrangements are utilized to turn the receivers on at predetermined times when a user wishes to be awakened and to turn the receiver off at predetermined times when stations go "off-the-air". The latter feature is useful as an energy conservation and safety measure should a user fall asleep.

Apparatus are also known for turning off receivers in the absence of any RF carriers with acceptable reception characteristics. Such apparatus employ signal detectors for evaluating properties of certain signals derived from received RF carriers.

Automatic turn-off apparatus of the timer and signal evaluation types require the addition of a considerable amount of special circuitry to receivers. Thus, there is a need for automatic turn-off apparatus which may be incorporated in receivers with only a small amount of additional circuitry.

SUMMARY OF THE PRESENT INVENTION

The present invention pertains to the type of electronic tuning system for a receiver which includes first tuning means for generating a first tuning control signal for tuning a tuner to standard frequencies associated with respective channels, second tuning means for generating a second tuning control signal for tuning a tuner to reduce deviations between the frequency of an IF carrier generated by the tuner and its desired or nominal value e.g., due to offsets in the frequencies of received RF carriers, and mode switching means for selectively applying the first and second tuning control signals to the tuner. The first tuning control signal is applied to the tuner after a new channel is selected. The second tuning control signal is applied to the tuner after the first tuning means has completed its operation. An offset detector determines when the frequency of a local oscillator signal generated by the tuner becomes offset from its frequency established by a predetermined amount when the second tuning control signal is coupled to the tuner. In response, the first tuning control signal is reapplied to the tuner.

In a receiver embodying the present invention, automatic turn-off means causes the receiver to be in its off condition when the first tuning control signal has been reapplied to the tuner a predetermined number of times. In a preferred embodiment of the present invention, a switching control signal generated by the mode switching means as the two tuning control signals are alternately applied to the tuner, is applied to capacitive means. Threshold means determines when a voltage developed by the capacitive means reaches a predetermined level and, in response, generates an off control signal to place the receiver in its off condition.

BRIEF DESCRIPTION OF THE DRAWING

The drawing includes a sole FIGURE which is a schematic diagram partially in block form of a television receiver employing the preferred embodiment of the present invention.

DETAILED DESCRIPTION OF THE DRAWING

A signal processing portion 1, of the receiver shown in the sole FIGURE includes a tuner 3, comprising a voltage tunable RF unit 5, a voltage controlled local oscillator (LO) 7, a tuning control system 9 for generating tuning control voltages for RF unit 5 and LO 7, and a mixer 11, for generating an IF signal having video and sound carriers. An IF signal processing unit 13 filters and amplifies the IF signal. A video processing unit 15 and a picture tube 17 act in conjunction to develop a visual response. A sound processing unit 19 and a speaker 21 act in conjunction to develop an audible response.

Various functions of the receiver are controllable by means of a remote control system comprising a remote control transmitter 23 and a remote control receiver 25. Specifically, remote control transmitter 23 is a battery powered unit which selectively transmits frequency encoded ultrasonic signals for increasing and decreasing the volume level of the audible response and for increasing and decreasing the number of the channel to which the receiver is tuned in response to the depression of the respective ones of four momentary pushbuttons 27a-27d. In addition, the receiver may be turned off by depressing the pushbutton for decreasing the volume until a minimum level is reached; and the receiver may be turned on by depressing the pushbutton for increasing the volume when the receiver is off, as will be more fully described below.

Remote control receiver 25 is powered by a standby power supply 29 and includes an input unit 31 for converting the ultrasonic signals to corresponding electrical signals and a decoder 33 for decoding the frequency encoded electrical signal to generate respective "up" (U) and "down" (D) control signals for a volume control unit 35 and a channel selection unit 37.

Volume control unit 35 includes an up/down counter (not specifically shown) for storing binary signals representing the volume level and a digital-to-analog converter (not specifically shown) for converting the contents of the up/down counter to a VOLUME gain control voltage. The gain control voltage determines the gain of an output stage (not specifically shown) of sound processing unit 19 and thereby determines the volume level. In response to the depression of the "volume up" or the "volume down" pushbutton, the contents of the up/down counter are increased or decreased and the volume level is changed accordingly.

In addition, when the VOLUME gain control voltage is caused to have an amplitude corresponding to a minimum volume level in response to the depression of the "volume down" pushbutton, a threshold detector 39 causes a relay drive transistor 41 to be nonconductive. As a result, the contacts of a relay 43 are opened and the AC line is decoupled from a main power supply 45 for signal processing portion 1 of the receiver and the receiver is turned off. When the receiver is off, after the volume gain control voltage is caused to have a predetermined amplitude above that corresponding to the minimum volume level in response to the depression of the "volume up" pushbutton, threshold detector 39 causes relay drive transistor 41 to be conductive. As a result, the contacts of relay 43 are closed and the receiver is turned on.

Channel selection unit 37 includes an up/down counter (not specifically shown) for storing binary signals representing the channel number of the channel to which the receiver is tuned by tuning control system 9. In response to the depression of the "channel up" or "channel down" pushbuttons, the contents of the channel number counter are increased or decreased and the channel number is changed accordingly.

The portions of the receiver so far described may be implemented in the same fashion as corresponding portions of CTC-93 television receivers with remote control provisions manufactured by RCA Corporation, Indianapolis, Ind. CTC-93 receivers are described in "RCA Service Data", File 1978, C-7 published by RCA Corporation, Indianapolis, Ind., hereby incorporated by reference.

RF signals are applied to tuner 1 through an RF signal source 39 which may, e.g., be master antenna or cable installations. Since such installations are not as strictly regulated by the Federal Communications Commission (FCC) as broadcast stations, the RF signals they provide may have nonstandard frequency carriers which are offset in frequency with respect to respective standard frequency carriers transmitted by broadcast stations. Tuning control system 9 generates tuning control voltages for controlling the frequency response of RF unit 5 and the frequency of the local oscillator signal generated by LO 7 so that the receiver can be tuned to nonstandard as well as standard frequency RF carriers.

Tuning system 9 is generally of the same type employed in RCA CTC-93 receivers and described in detail in U.S. Pat. No. 4,031,549, hereby incorporated by reference for the purpose of disclosing in detail how various portions of tuning system 9 discussed below may be implemented. Generally speaking, tuning system 9 includes: a phase locked loop (PLL) configuration for generating a first tuning control voltage for causing tuner 3 to be tuned to standard frequencies corresponding to the standard frequency RF broadcast carriers associated with selected channels; an AFT configuration for generating a second tuning control voltage for causing tuner 3 to be tuned so as to reduce deviations between the frequency of the picture carrier of the IF signal and its desired or nominal value, e.g., 45.75 MHz in the United States, which may occur due to the reception of nonstandard frequency RF carriers; and a mode selector apparatus for selectively causing the first and second tuning control voltages to be applied to tuner 3.

As described below tuning system 9 is advantageously employed in a dual capacity in conjunction with the volume control apparatus to turn the receiver off when the RF carrier for the selected channel is absent for a predetermined time. More specifically, in the absence of a carrier, the operations PLL and AFT configurations are alternately enabled as will be described below. A circuit responsive to a mode switching signal for selecting which of the configurations is operating determines when a number of alternate operating cycles of the two configurations has occurred and causes the VOLUME gain control signal to be decreased to the level at which the receiver is turned off.

The PLL configuration includes: a fixed frequency divider 41 and a programmable frequency divider 43 for successively dividing the frequency of the local oscillator signal generated by LO 7 by factors K and N, respectively, to derive a frequency-divided version of the local oscillator signal; a crystal oscillator 45; a fixed frequency divider 47 for dividing the frequency of the output signal of a crystal oscillator by a factor R to generate a frequency reference signal; and a phase comparator 49 for generating pulse error signals having polarities and durations respectively representing the sense and magnitude of the angular, i.e., phase and/or frequency, deviation between the frequency-divided local oscillator signal and the frequency reference signal.

The error pulses are selectively applied to an active low pass filter (LPF) or integrator 51 by the mode selection apparatus to be described below. In response to the error pulses, LPF 51 generates the first tuning control voltage for tuner 1. The operation of the PLL configuration is enabled when the first tuning control voltage is applied to tuner 1. During the operation of the PLL configuration, the magnitude of the first tuning control voltage changes in accordance with the angular deviation between the frequency-divided local oscillator signal and the frequency reference signal to reduce the deviation. When the deviation has been minimized, the frequency of the local oscillator signal, $f_{LO}$, will have a programmed value related to the frequency of the crystal oscillator signal, $f_{XTAL}$, by the following expression:

$$f_{LO} = N \frac{K}{R} f_{XTAL} \qquad (1)$$

The division factors K and R are selected to determine the operating frequency range of the PLL configuration. Desirably, the factor $$\frac{K}{R} f_{XTAL}$$

is made equal to 1 MHz, so that the programmable division factor of divider 43, N, is equal, in MHz to the frequency of the local oscillator signal.

The value of N is controlled by a control unit 53 in response to binary signals representing, in binary coded format, the channel number of the selected channel which are generated and stored in channel number counter 37.

The binary signals stored in channel number counter 37 are also applied to a channel number display unit 55 and a band decoder 57. Band decoder determines the frequency band in which the selected channel resides from the binary signals representing the channel number of the selected channel. Band decoder 57 generates a VL signal when the selected channel is in the low VHF band, i.e., channels 2-6; a VH signal when the selected channel is in the high VHF band, i.e., channels 7-13; and a U signal when the selected channel is in the UHF band, i.e., channels 14-83. The VL, VH and U signals control the selection of respective inductors (not shown) of tuned circuits (not shown) of RF unit 5 and LO 7 to control the tuning range of the tuned circuits. Each tuned circuit includes a voltage variable capacitance or varactor diode which determines the center frequency of the tuned circuit in response to one of the first and second tuning control voltages.

The AFT configuration includes an AFT discriminator 59 of the conventional type for generating an AFT signal having a generally S-shaped amplitude versus frequency characteristic representing the magnitude and sense of deviation of the frequency of the IF video carrier from its desired or nominal value, e.g., 45.75

MHz. The AFT signal is selectively applied to the input of active LPF 51 by the mode selection apparatus. In response, the second tuning control voltage is developed at the output of LPF 5. When the second tuning control voltage is applied to tuner 3, the operation of the AFT configuration is enabled. During the operation of the AFT configuration, the frequency of the local oscillator signal is adjusted from its value established during the operation of PLL configuration to correct for any deviations of the frequency of the IF video carrier from 45.75 MHz due to corresponding offsets of the frequency of the received RF carrier.

The mode switching apparatus for selectively coupling either the output of phase comparator or AFT discriminator to LPF includes a mode switch 61 comprising a double throw, single pole electronic switching device and a mode control unit 63 for controlling the "position" of mode switch 61. Mode circuit unit 63 includes: a flip flop (not specifically shown) for generating a MODE signal having a low logic level for causing mode switch 61 to apply to the output signal of phase comparator 49 to LPF 51 to enable the operation of the PLL configuration and a high logic level for causing mode switch 61 to apply the output signal of AFT discriminator 59 to LPF 51 to enable the operation of the AFT configuration; and combinational logic (not specifically shown) for controlling the state of the flip flop in response to signals generated by channel selection unit 37, a lock detector 65, and an offset detector 67.

When a new channel is selected in response to the depression of one of the "channel up" or "channel down" pushbuttons, a CHANGE pulse is generated by an OR gate (not specifically shown) of channel selection unit 37. In response to the CHANGE pulse, the MODE signal is set to its low level. In response to the low level, which will hereinafter be referred to as the PLL ENABLE level, mode switch 61 applies the error signal generated by phase comparator 49 to LPF 51 and thereby enables the operation of PLL configuration.

When the angular deviation between the frequency divided local oscillator signal and frequency reference signal has been substantially minimized, the pulses of the error signal generated by phase comparator 27 will have relatively short durations. LOCK detector 63 examines the durations of the error pulses generated by phase comparator 27. When the durations of the error pulses fall below a predetermined value corresponding to a relatively small angular deviation, lock detector 65 generates a LOCK signal. After a predetermined time period selected to ensure a small angular deviation between the frequency divided local oscillator signal, and determined by a counter (not specifically shown) within mode control unit 63, mode control unit 63 responds to the LOCK signal and causes the MODE signal to be set to its high level. In response to the high level, which will hereinafter be referred to as the AFT ENABLE level, mode switch 61 applies the AFT signal generated by AFT discriminator 59 to LPF 51 and thereby enables the operation of the AFT configuration.

At any time after the inititation of the AFT arrangement should the frequency of the local oscillator signal be offset from the value established during the operation of the PLL configuration by a predetermined amount, e.g., 1.25 MHz, offset detector 67 detects the occurrence and generates an OFFSET signal. In response to the OFFSET signal, the MODE signal is reset to its PLL level thereby ending the operation of the AFT configuration and reestablishing the operation of the PLL configuration. Local oscillator frequency offsets greater than 1.25 MHz are to be avoided to avoid tuning the receiver to the sound carrier of the lower adjacent channel which is separated from the video carrier of the selected channel by 1.5 MHz.

Since certain cable and master antenna installations provide nonstandard frequency RF carriers offset in frequency from respective standard frequency carriers typically by as much as ±2.0 MHz and since conventional AFT discriminators which may be employed as AFT discriminator 41 are not typically capable of generating an AFT signal for reliably correcting deviations between the frequency of the IF picture carrier and 45.75 MHz as large as ±2.0 MHz, the tuning system includes "stepping" apparatus 69 for incrementally changing the value of N in response to the OFFSET signal when the operation of the PLL configuration is reinitiated.

Specifically, in response to the first generation of the OFFSET signal during the first AFT operating cycle after a new channel is selected, a step counter 71, coupled to ÷ N control unit 53, is set to a predetermined state which causes the value of N to be increased by 1 with respect to the standard value for the selected channel and the operation of the PLL configuration is reinitiated. Accordingly, the frequency of the local oscillator signal is increased by 1 MHz with respect to the standard frequency for the selected channel. Thereafter, when the LOCK signal is again generated, the operation of the AFT arrangement is initiated for the second time. In this manner, the tuning system is capable of locating and tuning nonstandard frequency carriers which may be offset from respective standard frequency carriers by as much as +2.25 MHz (i.e., 1+1.25 MHz).

If no RF carrier is located for the increased value of N, a second OFFSET signal will be generated during the second AFT operating cycle when the frequency of the local oscillator signal is caused to be more than 1.25 MHz from the value established previously under the control of the PLL configuration. In response to the second generation of the OFFSET signal, step counter 71 is set to a state causing the value of N to be decreased by 1 with respect to its standard value for the selected channel and the operation of the PLL configuration is again reinitiated. Accordingly, the frequency of the local oscillator signal is increased by 1 MHz with respect to the standard frequency for the selected channel. Thereafter, when the LOCK signal is again generated, the operation of the AFT arrangement is initiated for the third time. In this manner, the tuning system is capable of locating and tuning nonstandard frequency carriers which may be offset from respective standard frequency carriers by as much as −2.25 MHz (i.e., −1 −1.25 MHz).

It is possible that the reception of an RF carrier may be temporarily interrupted, e.g., when an airplane passes over the reception area. When the RF carrier is again received, it is desirable that the value of N be the same as it was before the reception was interrupted. For this purpose, a timer 73 and an AND gate 75 are provided to prevent the value of N from changing after a predetermined time. Specifically, in response to the generation of a CHANGE pulse when a new channel is selected, timer 73, which may comprise a monostable multivibrator, generates a positive going pulse having a duration longer-than the time required to complete the three alternate operating cycles of the PLL configuration and the AFT arrangement. The positive-going pulse enables AND gate 75 to apply the OFFSET signal to the clock (C) input of step counter 71. After the positive-going pulse ends AND gate 75 is disabled from applying the OFFSET signal to step counter 71. As a result once an RF carrier has been located and tuned, the value of N at which it was originally tuned is maintained.

It is also possible, although not highly likely, for the reception of the RF carrier for a selected channel to be temporarily interrupted for a short time just after a channel is selected. It is most likely for an RF carrier to be located and tuned with the standard value of N for the selected channel rather than the value of N increased or decreased by 1. Accordingly, counter 71 is returned to, and thereafter maintained at, a state corresponding to the standard value of N for the selected channel in response to a third generation of the OFFSET signal during the predetermined time established by timer 73 in anticipation of the reestablishment of the reception of the RF carrier for the selected channel.

If an RF carrier is located within the ±2.25 range, the operation of the AFT configuration will be maintained. Accordingly, the MODE signal will remain at its AFT or high level. If no RF carrier is located, the operations of the PLL and AFT configurations continue to be alternately reinitiated. Accordingly, the MODE signal will alternately change from its PLL or low level to its AFT or high level. The duration of the PLL or low level of the MODE signal is relatively long compared to the duration of the AFT or high level of the MODE signal since the response time of the AFT configuration is relatively short compared to the predetermined time before mode control unit 63 enables the operation of the AFT configuration after the generation of the LOCK signal.

In the present receiver, apparatus is provided for turning the receiver off should the RF carrier for a selected channel be lost and thereafter remain absent for a predetermined time, e.g., when a broadcast station goes "off-the-air" which advantageously employs the MODE signal. Specifically, the MODE signal is applied to a capacitor 77 through a resistor 78. If the operation of the AFT configuration is maintained, indicating that an RF carrier is present, an ON/OFF control voltage developed across capacitor 77 is maintained at a high logic level in response to the maintenance of the MODE signal at the high or AFT level. In response to the high logic level ON/OFF control voltage developed across capacitor 77, an INVERTER 79 develops a low logic at its output which renders a NPN transistor 81 nonconductive. The collector to emitter path of transistor 81 shunts the control line between decoder 33 and the "volume down" input of volume control unit 35. As long as transistor 81 is nonconductive, the voltage at the "volume down" control line is maintained at a high logic level (except by virtue or user control) and the volume level, and correspondingly, the on/off status of the receiver remains unaffected.

If the operation of the AFT configuration is not maintained but alternates with the operation of the PLL configuration, indicating the absence of an RF carrier, the voltage across capacitor 77 begins to decrease as capacitor 77 is discharged in response to the alternate generation of the low or PLL level of the MODE signal. If this situation continues for a time dependent on the time constants associated with capacitor 77, resistor 78 and the input circuitry of INVERTER 79, capacitor 77 will be discharged and the ON/OFF control voltage is, as a result, caused to be at the low logic level. At that point, INVERTER 79 will generate a high logic level and transistor 81 will, as a result, be rendered conductive. In response, the "volume down" line will be caused to be at a low logic level and the VOLUME gain control voltage generated by volume control unit 35 will decrease. When the VOLUME gain control reaches the amplitude corresponding to the minimum volume level, the receiver will be turned off by means of threshold detector 39, relay drive transistor 41 and relay 43 as was previously described.

A positive supply voltage generated by standby power supply 29 is applied to capacitor 77 through a diode 83 to ensure that the ON/OFF control voltage developed across capacitor 77 is at the high logic level when the receiver is initially turned on. If this were not done, capacitor 77 would be initially discharged and transistor 81 would be rendered conductive as soon as the receiver was turned on and, as a result, by the action of conductive transistor 81 on the "volume down" control line, the receiver would again be turned off.

A NPN transistor 85 is rendered conductive when the receiver is turned on when a supply voltage developed by main power supply 45 is applied to its base. As a result, diode 83 is rendered non-conductive because the anode of diode 83 is connected to ground through the conductive collector to emitter path of transistor 85. Accordingly, the positive supply voltage generated by standby power supply 29 is decoupled from capacitor 77 and the voltage developed across capacitor 77 is thereafter dependent upon the MODE signal.

While the described receiver includes provisions, specifically, "stepping" control unit 69, for handling non-standard frequency RF carriers which are offset from respective standard frequency carriers by more than the fine tuning range of conventional AFT discriminators, such provisions may be omitted where the offsets are not so large. In addition, other signals manifesting the termination of the AFT operating mode, such as the OFFSET signal generated by offset detector 67 may be employed to cause the receiver to be turned off when the RF carrier for a selected channel is absent for a predetermined time.

These and other modifications are intended to be within the scope of the present invention as defined by the following claims.

What we claim is:

1. In a receiver, apparatus comprising:
    local oscillator means for generating a local oscillator signal having a frequency capable of being controlled;
    mixer means for combining an RF carrier and said local oscillator signal to derive an IF signal having at least one carrier with a nominal frequency value;
    phase locked loop (PLL) means for controlling said local oscillator means when enabled to operate to cause said local oscillator signal to have a programmed frequency substantially equal to the product of a programmable factor and the frequency of a frequency reference signal;
    channel selection means for determining said programmable factor in accordance with selected channel and for generating a CHANGE signal when a new channel is selected;
    lock means for generating a LOCK signal when said local oscillator signal has said programmed frequency;

automatic fine tuning (AFT) means for selectively controlling said local oscillator means when enabled to operate to reduce a deviation between the actual frequency of said IF carrier and said nominal frequency value;

mode means for selectively enabling the operations of said PLL and AFT means, said mode means enabling the operation of said PLL means in response to said CHANGE signal, said mode means enabling the operation of said AFT means in response to said LOCK signal;

offset detector means for generating an OFFSET signal when the frequency of said local oscillator signal is caused to be offset from said programmed frequency by a predetermined amount during the operation of said AFT means;

said mode means enabling the operation of said PLL in response to said OFFSET signal;

main power supply means for generating supply voltages for said receiver;

main power supply control means for selectively enabling said power supply means to generate said supply voltages and thereby selectively causing said receiver to be in an on or off condition; and mode responsive means coupled to said power supply control means for causing said receiver to be in said off operating condition when said mode means causes the operations of said PLL and AFT means to be alternately enabled a predetermined number of times after the generation of said CHANGE signal.

2. The apparatus recited in claim 1 wherein:
said mode means generates a MODE signal having first and second levels corresponding to the respective operations of said PLL and AFT means; and
said mode responsive means includes capacitor means for developing an ON/OFF signal in response to said MODE signal, said ON/OFF signal being applied to said main power supply control means to cause said receiver to be in said off condition when said ON/OFF signal reaches a first predetermined level.

3. The apparatus recited in claim 2 wherein:
said mode responsive means includes initialization means coupled to said capacitor means for causing said ON/OFF signal to have a second predetermined level to cause said receiver to remain in the on condition for a predetermined time after said receiver is initially caused to be in the on condition.

4. The apparatus recited in claim 3 wherein:
said receiver further includes function control means responsive to a function control signal for causing a predetermined analog function of said receiver to be changed in first and second opposite senses; manually operable means for selectively causing said function control signal to be selectively changed to affect said changes of said analog function in said first and second senses; and threshold means coupled to said power supply means for causing said receiver to be in said off condition when said function control signal reaches a third predetermined level; and wherein
said mode responsive means includes switch means coupled to said manually operable means for causing said function control signal to be at least at said third predetermined threshold level when said ON/OFF signal reaches said first predetermined level.

5. The apparatus recited in claim 4 wherein:
said function control means includes volume control means for controlling the volume level of said receiver in response to said function control signal; said function control signal causes said volume level to be selectively decreased and increased; and said third predetermined level corresponds at least approximately to the minimum volume level.

6. The apparatus recited in claim 5 wherein:
said function control means includes remote control transmitter means for selectively transmitting remote control signals related to increases and decreases in the volume level; remote control receiver means for receiving said remote control signals and deriving therefrom said function control signal; and standby power means for generating supply voltages for said remote control receiver means when said receiver is in said off condition; and
said initialization means includes a second switch means for selectively applying one of said supply voltages generated by said standby power supply means to said capacitor means when said receiver is in said off condition.

7. The apparatus recited in claim 6 wherein:
said second switch means is responsive to one of said supply voltages generated by said main power supply means to interrupt the application of said one of said supply voltages generated by said standby power supply means from said capacitor means when said receiver is in said on condition.

8. In a receiver, apparatus comprising:
local oscillator means for generating a local oscillator signal having a frequency capable of being controlled;
mixer means for combining an RF carrier and said local oscillator signal to derive an IF signal having at least one carrier with a nominal frequency value;
phase locked loop (PLL) means for controlling said local oscillator means when enabled to operate to cause said local oscillator signal to have a programmed frequency substantially equal to the product of a programmable factor and the frequency of a frequency reference signal;
channel selection means for determining said programmable factor in accordance with selected channel and for generating a CHANGE signal when a new channel is selected;
lock detector means for generating a LOCK signal when said local oscillator signal has locked to said programmed frequency;
automatic fine tuning (AFT) means for selectively controlling said local oscillator means when enabled to operate to reduce a deviation between the actual frequency of said IF carrier and said nominal frequency value;
offset detector means for generating an OFFSET signal when the frequency of said local oscillator signal is caused to be offset from said programmed frequency by a predetermined amount during the operation of said AFT means;
mode control means for selectively enabling the operations of said PLL and AFT means, said mode control means enabling the operation of said PLL means in response to said CHANGE signal, said mode control means enabling the operation of said AFT means in response to said LOCK signal, said mode control means enabling the operation of said PLL in response to said OFFSET signal;

signal processing means producing an information response in response to said IF signal; and mode responsive means coupled to said signal processing means for inhibiting said information response when said mode means causes the operations of said PLL and AFT means to be alternately enabled a predetermined number of times after the generation of said CHANGE signal.

9. The apparatus recited in claim 8 further including:

main power supply means for generating supply voltages for said receiver;

main power supply control means for selectively enabling said main power supply means to generate said supply voltages and thereby selectively causing said receiver to be in an on or off condition; and threshold detector means coupled to said main power control means for causing said receiver to be in said off condition when said information response has been inhibited.

10. The apparatus recited in claim 9, wherein:

said signal processing means produces an audible response.

* * * * *

UNITED STATES PATENT AND TRADEMARK OFFICE
CERTIFICATE OF CORRECTION

PATENT NO. : 4,241,450

DATED : December 23, 1980

INVENTOR(S) : Harold Blatter et al.

It is certified that error appears in the above—identified patent and that said Letters Patent is hereby corrected as shown below:

Column 3, line 47, change "selector" to --selection--.

Column 5, line 21, cancel "to" (second occurrence).

Column 10, line 16, after "power" insert --supply--.

In the Abstract, line 6, change "the" (second occurrence) to --an--.

Signed and Sealed this

Fourteenth Day of April 1981

[SEAL]

Attest:

RENE D. TEGTMEYER

Attesting Officer     Acting Commissioner of Patents and Trademarks